United States Patent
Sim

(10) Patent No.: US 11,477,857 B2
(45) Date of Patent: Oct. 18, 2022

(54) FLUIDIC CHIP

(71) Applicant: CELL ID PTE LTD, Singapore (SG)

(72) Inventor: Lye Hock Sim, Singapore (SG)

(73) Assignee: CELL ID PTE LTD, Singapore (SG)

( * ) Notice: Subject to any disclaimer, the term of this patent is extended or adjusted under 35 U.S.C. 154(b) by 300 days.

(21) Appl. No.: 16/899,346

(22) Filed: Jun. 11, 2020

(65) Prior Publication Data

US 2020/0305241 A1   Sep. 24, 2020

Related U.S. Application Data

(60) Division of application No. 15/727,588, filed on Oct. 7, 2017, now Pat. No. 10,750,577, which is a (Continued)

(51) Int. Cl.
*B01L 3/00* (2006.01)
*H05B 3/34* (2006.01)
(Continued)

(52) U.S. Cl.
CPC ............... *H05B 3/34* (2013.01); *B01L 3/505* (2013.01); *B01L 3/50825* (2013.01); *B01L 3/50851* (2013.01); *B01L 3/50855* (2013.01); *B01L 3/502715* (2013.01); *B01L 3/502784* (2013.01); *B01L 7/52* (2013.01); *H05B 3/267* (2013.01); *B01J 2219/00495* (2013.01); *B01J 2219/00533* (2013.01); *B01L 2300/0887* (2013.01); *B01L 2300/0893* (2013.01); *B01L 2300/0896* (2013.01); *B01L 2300/123* (2013.01); *B01L 2300/1805* (2013.01); *B01L 2300/1827* (2013.01); *B81B 7/0083* (2013.01); *B81B 2201/058* (2013.01); *H05B 2203/002* (2013.01); *H05B 2203/003* (2013.01)

(58) Field of Classification Search
CPC ............................ H05B 3/34; B01L 3/502715
USPC ......................................................... 422/502
See application file for complete search history.

(56) References Cited

U.S. PATENT DOCUMENTS 6,255,677 B1   7/2001   Caillat et al.
6,533,255 B1   3/2003   Mitsuhashi et al.
(Continued)

FOREIGN PATENT DOCUMENTS

CN    101848765 A    9/2010
DE    102012219656 A1    4/2014
(Continued)

OTHER PUBLICATIONS

Office Action dated Feb. 23, 2017, U.S. Appl. No. 14/893,002, filed Nov. 20, 2015.
(Continued)

*Primary Examiner* — Christine T Mui
*Assistant Examiner* — Emily R. Berkeley

(57) ABSTRACT

A fluidic chip comprising: a sealing layer having an upper surface and a lower surface; and a formed part comprising a generally planar body having a lower surface sealed with the upper surface of the sealing layer, the generally planar body having a number of through holes and a number of wells in fluid communication with the number of through holes, wherein together with the upper surface of the sealing layer, the number of through holes and the number of wells respectively define a number of fluid inlets and a number of fluid chambers in fluid connection with each other in the fluidic chip.

10 Claims, 5 Drawing Sheets

Related U.S. Application Data continuation of application No. PCT/SG2016/050171, filed on Apr. 7, 2016, which is a continuation-in-part of application No. PCT/SG2015/050062, filed on Apr. 7, 2015.

(51) Int. Cl.
    *B01L 7/00*   (2006.01)
    *H05B 3/26*   (2006.01)
    *B81B 7/00*   (2006.01)

(56) References Cited

U.S. PATENT DOCUMENTS

| | | |
|---|---|---|
| 7,588,804 B2 | 9/2009 | Dando |
| 9,999,100 B2 | 6/2018 | Sim et al. |
| 10,638,547 B2 | 4/2020 | Sim et al. |
| 10,750,577 B2 | 8/2020 | Sim et al. |
| 2002/0079219 A1 | 6/2002 | Zhao et al. |
| 2002/0127152 A1 | 9/2002 | Benett et al. |
| 2002/0150683 A1 | 10/2002 | Troian et al. |
| 2002/0192112 A1 | 12/2002 | Chow |
| 2003/0094953 A1 | 5/2003 | Brooks et al. |
| 2003/0183620 A1 | 10/2003 | Wong |
| 2003/0190265 A1 | 10/2003 | Anazawa et al. |
| 2005/0028587 A1 | 2/2005 | Baer et al. |
| 2007/0049869 A1 | 3/2007 | Park |
| 2007/0111302 A1 | 5/2007 | Handique et al. |
| 2008/0026430 A1 | 1/2008 | Sarofim et al. |
| 2008/0083740 A1 | 4/2008 | Kaiserman et al. |
| 2008/0286153 A1 | 11/2008 | Lee |
| 2009/0082219 A1 | 3/2009 | Ermantraut et al. |
| 2009/0186404 A1 | 7/2009 | Kim et al. |
| 2011/0124049 A1 | 5/2011 | Li et al. |
| 2012/0122721 A1 | 5/2012 | Fernandez et al. |
| 2012/0270225 A1 | 10/2012 | Wakeley et al. |
| 2014/0162244 A1 | 6/2014 | Bau et al. |
| 2017/0094724 A1 | 3/2017 | Sim et al. |
| 2018/0029036 A1 | 2/2018 | Sim et al. |
| 2018/0035490 A1 | 2/2018 | Sim et al. |

FOREIGN PATENT DOCUMENTS

| | | |
|---|---|---|
| EP | 0890651 A1 | 1/1999 |
| JP | H05326117 A | 12/1993 |
| JP | 11127900 A | 5/1999 |
| JP | 2002532239 A | 10/2002 |
| JP | 2003323219 A | 11/2003 |
| JP | 200431147 A | 1/2004 |
| JP | 2005501712 A | 1/2005 |
| JP | 2005214782 A | 8/2005 |
| JP | 2008151771 A | 7/2008 |
| JP | 2009119386 A | 6/2009 |
| JP | 2013509173 A | 3/2013 |
| JP | 2014507669 A | 3/2014 |
| JP | 2014092420 A | 5/2014 |
| JP | 2014146478 | 8/2014 |
| WO | 0224322 A3 | 3/2002 |
| WO | 2007099736 A1 | 9/2007 |
| WO | 2009019658 A2 | 2/2009 |
| WO | 2012170486 A1 | 12/2012 |
| WO | 2013044217 A1 | 3/2013 |
| WO | 2014052590 A1 | 4/2014 |
| WO | 2016163946 A1 | 10/2016 |
| WO | 2016163956 A1 | 10/2016 |
| WO | 2016163957 A1 | 10/2016 |

OTHER PUBLICATIONS

Final Office Action dated Jun. 6, 2017, U.S. Appl. No. 14/893,002, filed Nov. 20, 2015.
Advisory Action dated Sep. 27, 2017, U.S. Appl. No. 14/893,002, filed Nov. 20, 2015.
Notice of Allowance dated Oct. 24, 2017, U.S. Appl. No. 14/893,002, filed Nov. 20, 2015.
Office Action dated Feb. 6, 2018, U.S. Appl. No. 15/727,589, filed Oct. 7, 2017.
Final Office Action dated Sep. 19, 2018, U.S. Appl. No. 15/727,589, filed Oct. 7, 2017.
Advisory Action dated Jan. 7, 2019, U.S. Appl. No. 15/727,589, filed Oct. 7, 2017.
Office Action dated Mar. 5, 2019, U.S. Appl. No. 15/727,589, filed Oct. 7, 2017.
Final Office Action dated Aug. 27, 2019, U.S. Appl. No. 15/727,589, filed Oct. 7, 2017.
Advisory Action dated Dec. 11, 2019, U.S. Appl. No. 15/727,589, filed Oct. 7, 2017.
Notice of Allowance dated Jan. 21, 2020, U.S. Appl. No. 15/727,589, filed Oct. 7, 2017.
Restriction Requirement dated Jul. 31, 2019, U.S. Appl. No. 15/727,588, filed Oct. 7, 2017.
Office Action dated Oct. 11, 2019, U.S. Appl. No. 15/727,588, filed Oct. 7, 2017.
Notice of Allowance dated Apr. 22, 2020, U.S. Appl. No. 15/727,588, filed Oct. 7, 2017.
Sim, Lye Hock, et al., "A DC Heater," filed Nov. 20, 2015, U.S. Appl. No. 14/893,002.
Sim, Lye Hock, et al., "Fluidic Chip," filed Oct. 7, 2017, U.S. Appl. No. 15/727,588.
Sim, Lye Hock, et al., "Digital PCR Device," filed Oct. 7, 2017, U.S. Appl. No. 15/727,589.
Foreign Communication From A Related Counterpart Application, International Search Report and Written Opinion dated Jun. 30, 2015, International Application No. PCT/SG2015/050062 filed on Apr. 7, 2015.
Foreign Communication From a Related Counterpart Application, International Search Report and Written Opinion dated Jun. 17, 2016, International Application No. PCT/SG2016/050171 filed on Apr. 7, 2016.
Foreign Communication From a Related Counterpart Application, International Preliminary Report dated Apr. 7, 2017, International Application No. PCT/SG2016/050171 filed on Apr. 7, 2016.
Foreign Communication From a Related Counterpart Application, European Extended Search Report dated Aug. 12, 2016, European Application No. 15788314.1, National Phase of PCT/SG2015/050062.
Ohlander, A., et al., "Real-Time Monitoring of Melting Curves On DNA Microarrays in Plastic Lab-On-Foil System Using Silicon Photomultiplier Detectors" 18th International Conference on Minaturized Systems for Chemistry and Life Sciences, Oct. 26, 2014.
McDonald, J. Cooper, et al., "Poly(dimethylsiloxane) as a Material for Fabricating Microfluidic Devices," American Chemical Society, Accounts of Chemical Research, vol. 35, No. 7, Jul. 2002.
Foreign Communication from a Related Counterpart Application, Japanese Notice of Reasons for Refusal dated Feb. 19, 2020, Japanese Application No. 2017552824 filed on Apr. 7, 2016.
Foreign Communication from a Related Counterpart Application, Japanese Notice of Reasons for Refusal dated Jun. 29, 2020, Japanese Application No. 2017552824 filed on Apr. 7, 2016.
Foreign Communication from a Related Counterpart Application, Chinese Office Action dated Mar. 2, 2020, Chinese Application No. 201680028284.2 filed on Apr. 7, 2016.
Foreign Communication from a Related Counterpart Application, Chinese Office Action dated Jun. 28, 2019, Chinese Application No. 201680028284.2 filed on Apr. 7, 2016.
Foreign Communication from a Related Counterpart Application, Korean Office Action dated May 27, 2021, Korean Application No. 20157033265 filed on Apr. 7, 2015.
Foreign Communication from a Related Counterpart Application, Japanese Decision of Refusal dated Mar. 15, 2021 Japanese Application No. 2017552824 filed on Apr. 7, 2016.

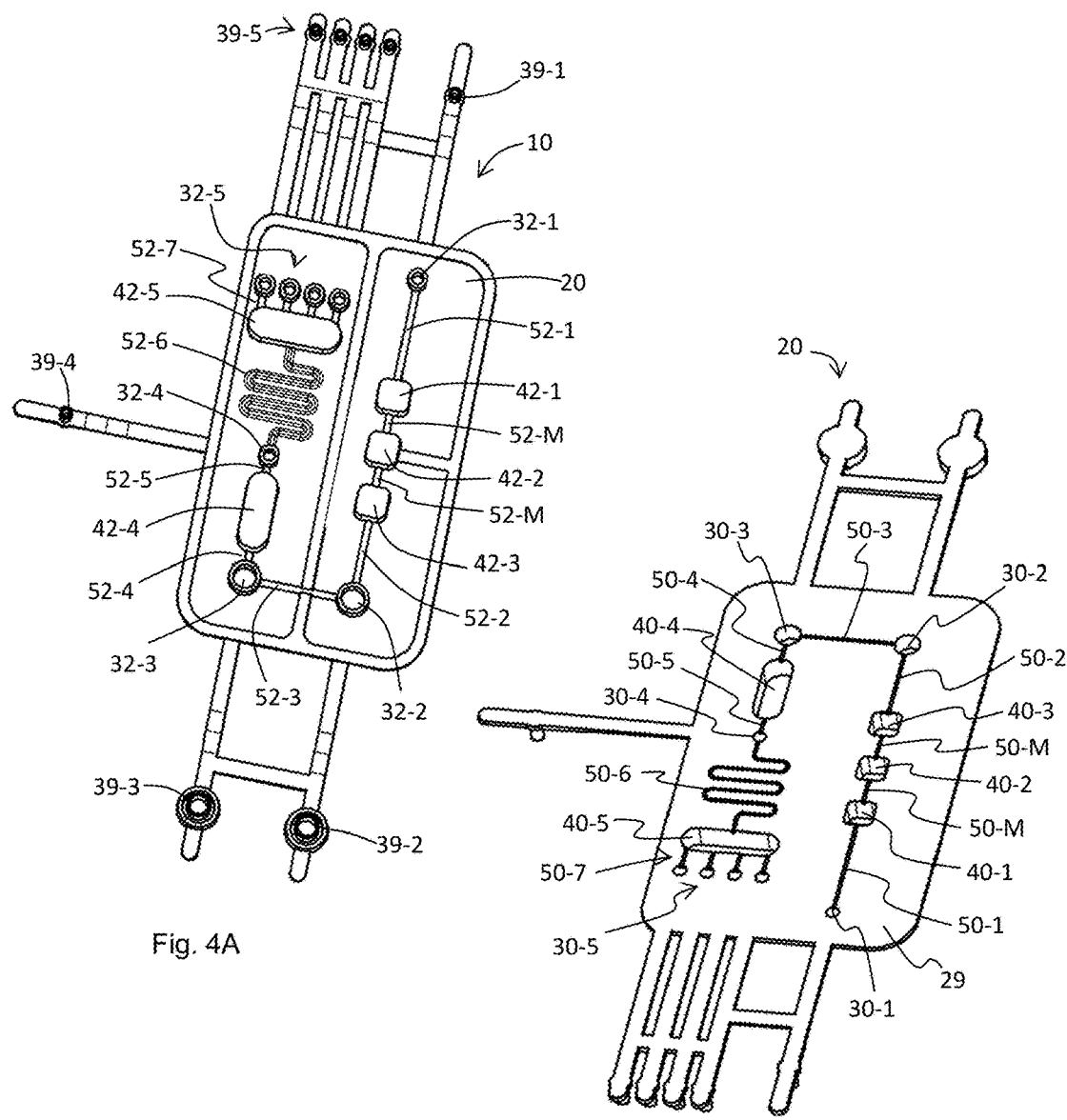
Fig. 4A
Fig. 4B
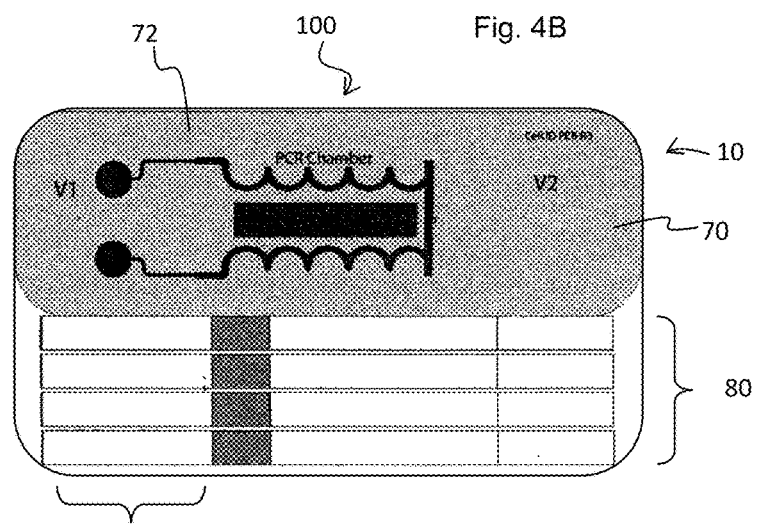
Fig. 4C

FLUIDIC CHIP

CROSS REFERENCE TO RELATED APPLICATIONS

This application is a divisional of and claims priority to U.S. application Ser. No. 15/727,588, filed on Oct. 7, 2017, entitled "FLUIDIC CHIP," by Lye Hock SIM, which is a continuation of and claims priority to International Application PCT/SG2016/050171, filed on Apr. 7, 2016 and entitled "FLUIDIC CHIP," by Lye Hock SIM, which is a continuation-in-part of and claims priority to International Application PCT/SG2015/050062, filed on Apr. 7, 2015 and entitled "A DC HEATER", by Lye Hock SIM, all of which are incorporated herein by reference in their entirety for all purposes.

FIELD OF THE INVENTION

This invention relates to a fluidic chip, and in particular, to a fluidic chip for storage and testing of biological fluids therein.

BACKGROUND OF THE INVENTION

PCR is a commonly used method to make multiple copies of a DNA sequence for various applications such as DNA cloning for sequencing, diagnosing disease, identifying individuals from DNA samples, and performing functional analyses of genes. In PCR, replication of the DNA sequence takes place in multiple thermal cycles, with each cycle typically having three main steps: denaturation, annealing and extension. In the denaturation step, a double-stranded DNA template is heated to about 94-98° C. for 20-30 seconds to yield single-stranded DNA. In the annealing step, primers are annealed to the single-stranded DNA by lowering the temperature to about 50-65° C. for 20-40 seconds. In the extension step, using a DNA polymerase (such as Taq), a new double-stranded DNA is synthesized by extending the primer that has been annealed to the single-stranded DNA at an optimum activity temperature of the DNA polymerase (75-80° C. for Taq). Appreciably, replication of the DNA is exponential as the new double-stranded DNA formed in a cycle undergoes denaturation, annealing and extension in the next cycle, such that each cycle effectively doubles the number of DNA sequences obtained. In addition to the three main steps mentioned above, an initialization step may be required if the DNA polymerase used is heat activated, and the final extension step of the last cycle may be held for a longer period of time (e.g. 5-15 minutes) to ensure that there are no remaining single-stranded DNA fragments.

Thus, any device for performing the PCR needs to be able to perform the repeated thermal cycles in order for the steps of denaturation, annealing and extension to take place. This involves heating and cooling the reaction to the required temperatures and holding the required temperatures for the necessary lengths of time. Given that temperatures go up to nearly 100° C., existing microfluidic or lab-on-chip PCR devices typically require an external thermal cycler to supply the necessary heat, thereby limiting their true portability and size during use.

Conventional PCR thermal cyclers are typically configured to heat DNA samples contained in polypropylene PCR tubes that have a cylindrical body with a top opening and a taped bottom. The PCR tubes fit into holes provided in the PCR thermal cyclers and are subjected to the heat cycles provided by the PCR thermal cyclers in order to multiply the DNA sample contained in the PCR tubes. Subsequently, the multiplied DNA are removed from the PCR tubes in order for tests to be performed on the multiplied DNA. Thus, it will be appreciated that tests involving the use of DNA currently involve multiple stages. These stages include at least sample collection and storage, placing the sample in PCR tubes, placing the PCR tubes into PCR thermal cyclers and performing the PCR, removing the multiplied DNA from the PCR tubes and performing tests using the multiplied DNA. It is therefore desirable to reduce the number of steps needed for performing tests using DNA in order to minimize errors arising from human handling of the samples at various stages of the process.

SUMMARY OF INVENTION

According to a first aspect, there is provided a fluidic chip comprising: a sealing layer having an upper surface and a lower surface; and a formed part comprising a generally planar body having a lower surface sealed with the upper surface of the sealing layer, the generally planar body having a number of through holes and a number of wells in fluid communication with the number of through holes, wherein together with the upper surface of the sealing layer, the number of through holes and the number of wells respectively define a number of fluid inlets and a number of fluid chambers in fluid connection with each other in the fluidic chip.

The lower surface of the sealing layer may be electrically non-conductive and provided with a dc heater having a discrete heating area made of a heat conductive material disposed on the lower surface of the sealing layer and a conductive trace configured to be supplied with a dc voltage and to heat the discrete heating area to a uniform temperature when supplied with the dc voltage, the conductive trace disposed in an undulating configuration on the lower surface of the sealing layer at least partially around the discrete heating area, the discrete heating area configured to be adjacent at least one of the number of fluid chambers.

The at least one of the number of fluid chambers adjacent the discrete heating area may be configured to allow PCR to be performed therein.

The fluidic chip may further comprise at least one lateral test strip provided beneath the sealing layer, the at least one lateral test strip having a sample pad configured to receive fluid contained in the fluidic chip.

The sealing layer may be pliable and fluid-proof.

The number of through holes and the number of wells may be integral with the generally planar body.

The generally planar body may further comprise a number of grooves formed on the lower surface of the generally planar body, wherein together with the upper surface of the sealing layer, the number of grooves define a number of channels in fluid connection with the number of fluid inlets and the number of fluid chambers in the fluidic chip.

According to a second aspect, there is provided a PCR kit comprising: the fluidic chip of the first aspect and a controller cassette configured to provide and control the dc voltage supplied to the dc heater, the controller cassette having conductive contact points configured to form an electrical contact with terminals of the conductive trace of the dc heater of the fluidic chip, the controller cassette configured to be powered by at least one of: a battery, a power bank and drawing power from a portable computing device.

The controller cassette may be configured to be connected to the portable computing device to allow the controller cassette to be programmed to generate desired voltage cycles of the dc voltage for providing desired thermal cycling configurations to the fluidic chip.

The controller cassette may be configured to receive the fluidic chip thereon for the conductive contact points to come into contact with the terminals of the conductive trace of the dc heater.

According to a third aspect, there is provided a formed part for forming a fluidic chip, the formed part comprising: a generally planar body having a number of through holes and a number of wells in fluid communication with the number of through holes, a lower surface of the generally planar body configured to be sealed with an upper surface of a sealing layer of the fluidic chip, wherein together with the upper surface of the sealing layer, the number of through holes and the number of wells respectively define a number of fluid inlets and a number of fluid chambers in fluid connection with each other in the fluidic chip when the lower surface of the planar body is sealed with the upper surface of the sealing layer.

At least one of the number of through holes may be encircled by an inlet wall projecting outwardly from an upper surface of the generally planar body.

At least one of the number of through holes may be surrounded by a shallow depression formed into an upper surface of the generally planar body.

The number of through holes and the number of wells may be integral with the generally planar body.

The formed part may further comprise a number of grooves formed on the lower surface of the generally planar body, wherein together with the upper surface of the sealing layer, the number of grooves define a number of channels in fluid connection with the number of fluid inlets and the number of fluid chambers in the fluidic chip when the lower surface of the planar body is sealed with the upper surface of the sealing layer.

BRIEF DESCRIPTION OF FIGURES

In order that the invention may be fully understood and readily put into practical effect there shall now be described by way of non-limitative example only exemplary embodiments of the present invention, the description being with reference to the accompanying illustrative drawings.

FIG. 4A is a schematic top view of a fourth exemplary fluidic chip having resealable fluid inlets.

FIG. 4B is a schematic bottom view of the formed part of the fourth exemplary fluidic chip of FIG. 4A.

FIG. 4C is a schematic bottom view of the fluidic chip of FIG. 4A (inlet caps and cap connecting strips not shown)

DETAILED DESCRIPTION

Figure 1A:
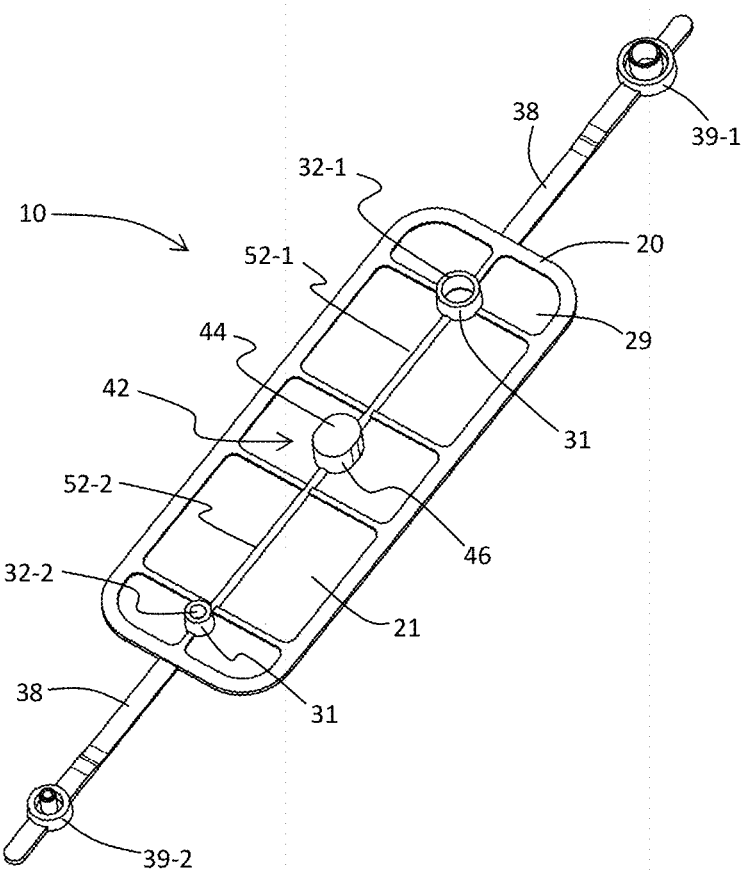
FIG. 1A is a top perspective view of a first exemplary fluidic chip having resealable fluid inlets.

Exemplary embodiments of a fluidic chip 10 and its various applications will be described below with reference to FIGS. 1 to 6C. The same reference numerals are used throughout the figures to denote the same or similar parts.

Figure 1B:
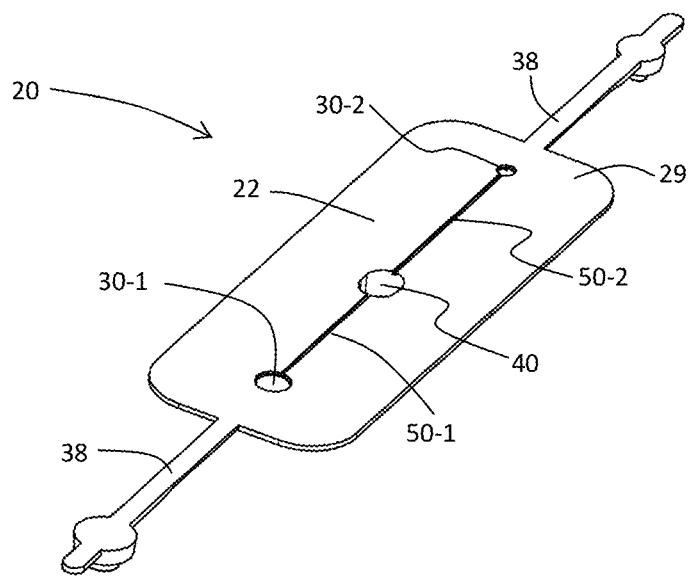
FIG. 1B is a bottom perspective view of a formed part of the first exemplary fluidic chip of FIG. 1A.
Figure 2A:
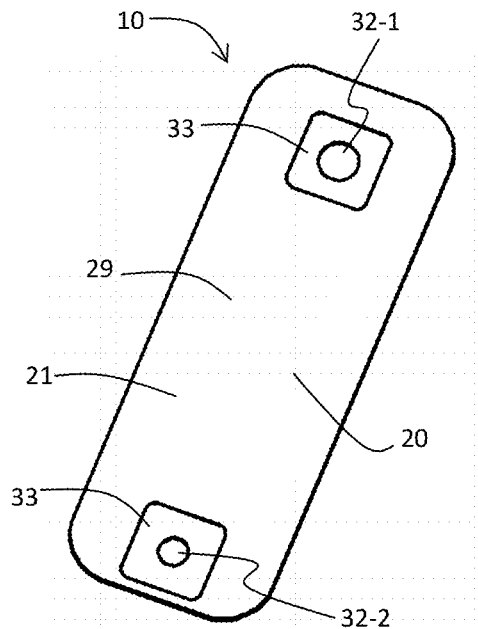
FIG. 2A is a top perspective view of a second exemplary fluidic chip.
Figure 2B:
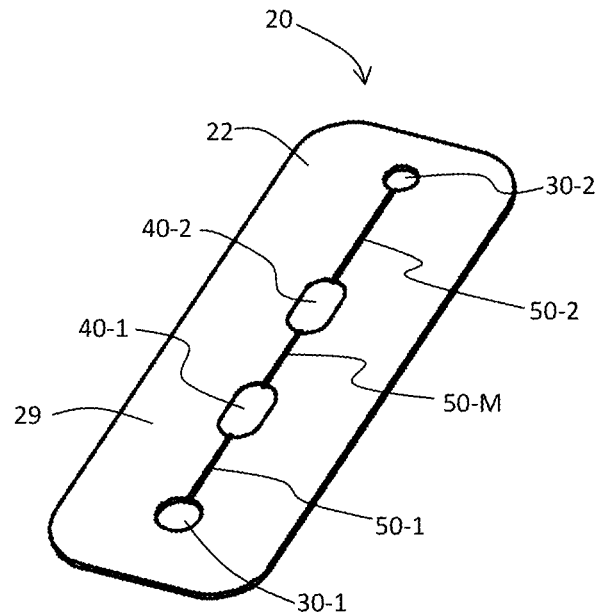
FIG. 2B is a bottom perspective view of a formed part of the fluidic chip of FIG. 2A.
Figure 3A:
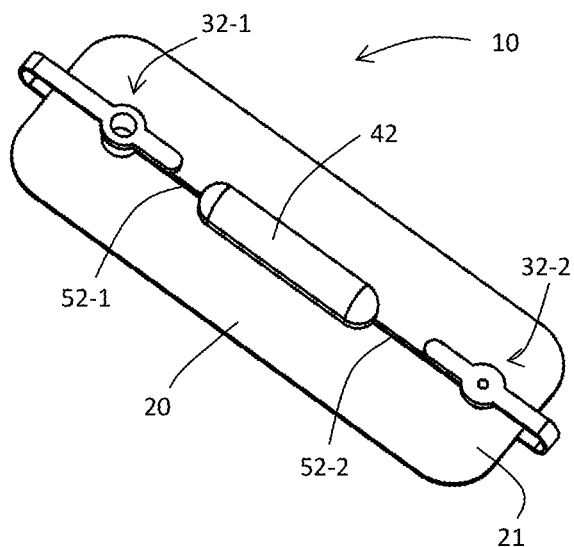
FIG. 3A is a schematic top view of a third exemplary fluidic chip having resealable fluid inlets.
Figure 3B:
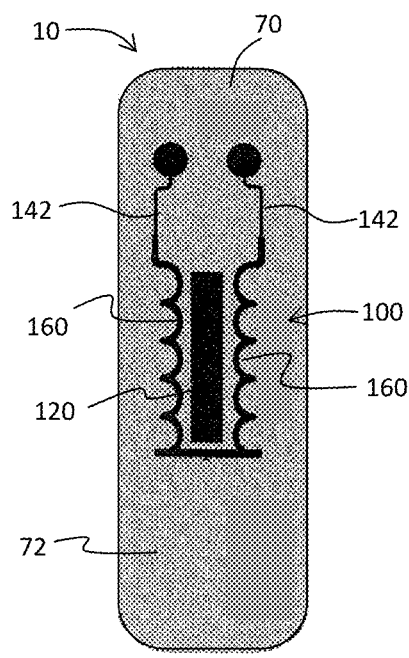
FIG. 3B is a schematic bottom view of the fluidic chip of FIG. 3A (cap connecting strips not shown).
Figure 5:
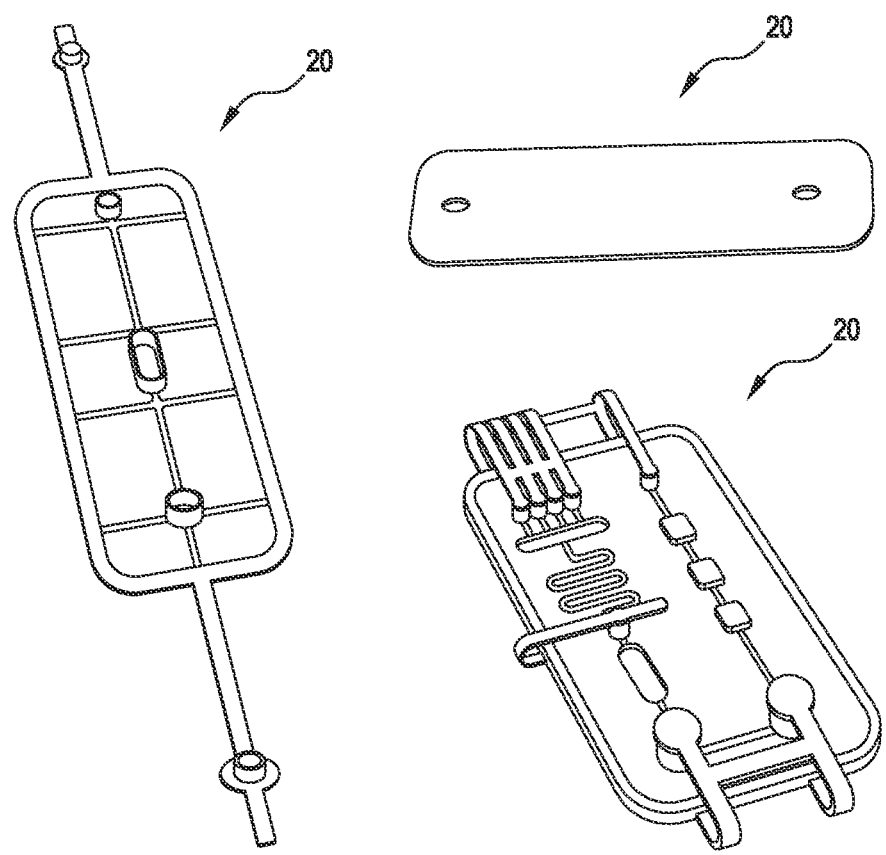
FIG. 5 is a photograph showing different embodiments of formed parts for different embodiments of the fluidic chip.

For all embodiments, the fluidic chip 10 comprises a formed part 20 comprising a generally planar body 29 having an upper surface 21 and a lower surface 22 (as shown in FIGS. 1A to 2B and FIGS. 4a and 4B), and a fluid-proof sealing layer 70 having an upper surface (hidden) sealed with the lower surface 22 of the planar body 29 (as shown in FIGS. 3B and 4C).

The formed part 20 is made of a biologically inert, fluid-proof material (e.g. polypropylene, as shown in FIG. 3) that is suitable for storing biological fluids therein, such as blood. The formed part 20 is made via conventional forming methods such as vacuum forming, plastics injection moulding and the like. The formed part 20 comprises a number of features including one or more through holes 30 to serve as fluid inlets 32, one or more wells 40, and one or more grooves 50 configured to provide fluid communication between the through holes 30 and the wells 40. In this way, when the formed part 20 is sealed with the sealing layer 70, the fluidic chip 10 will comprise a corresponding number of fluid inlets 32, fluid chambers 42 and channels 52 that are in fluid communication with each other, as will be described in greater detail below. The upper surface of the sealing layer 70 is made of a pliable, fluid-proof, biologically inert material. The sealing layer 70 may comprise one or more pliable layers or structures. The lower surface 22 of the planar body 29 and the upper surface of the sealing layer 70 are configured to be joined together by means such as adhesive bonding, molecular bonding, and ultrasonic bonding to form a fluid-proof seal therebetween.

Each fluid inlet 32 of the fluidic chip 10 comprises a through hole 30 provided in the planar body 29 to allow fluid to be placed in the fluidic chip 10. In some embodiments, as shown in FIG. 2B, the through hole 30 of each fluid inlet 32 may be surrounded by a shallow depression 33 formed into the upper surface 21 of the planar body 29—for example, the planar body 29 may be 0.5 mm thick and the shallow depression 33 may have a depth of 0.1 mm formed into the upper surface 21 of the planar body 29. In other embodiments, as shown in FIGS. 1A, 1B, 3A, 4A, and 4B, the through hole 30 of each fluid inlet 32 may be encircled by an inlet wall 31 projecting outwardly from the upper surface 21 of the planar body 29. For each fluid inlet 32, an inlet cap 39 may be provided and configured to releasably seal the fluid inlet 32 to prevent fluid from leaving the fluidic chip 10 when the fluid inlet 32 is closed by the inlet cap 39. The inlet cap 39 and the inlet wall 31 are preferably configured to engage each other via an interference fit. The inlet cap 39 is further preferably configured to be connected to the planar body 29 via a cap connecting strip 38 so that the inlet cap 39 may not be lost by separation from the formed part 20. The inlet cap 39, the cap connecting strip 38 and the inlet wall 31 are preferably integral with the planar body 29. As shown in FIGS. 1A, 1B, 3A, 4A, and 4B, the cap connecting strip 38 may be coplanar with the generally planar body 29 when the inlet 39 is not closing its corresponding fluid inlet 32.

Each fluid chamber 42 of the fluidic chip 10 is configured for storing a fluid therein. Depending on the application of use of the fluidic chip 10, the fluid chamber 42 may also be configured to store therein a solid or semi-solid such as biological tissue. Each fluid chamber 42 is a space defined by a well 40 provided in the formed part 20. In some embodiments, as shown in FIG. 2A, the wells 40 may each comprise a depression or space formed into the material or thickness of the planar body 29—for example, the planar body 29 may be 0.5 mm thick and the well 40 may be a space having a depth of 0.1 mm formed into the lower surface 22 of the planar body 29. In other embodiments, as shown in FIGS. 1A, 1B, 3A, 4A, and 4B, the wells 40 may each comprise a well bottom 44 that is connected to and spaced apart from the upper surface 21 of the planar body 29 by a well wall 46 encircling the well bottom 44. For all embodiments, each well 40 is preferably integral with the planar body 29. The well 40 and the upper surface of the sealing layer 70 together define the fluid chamber 42 when the lower surface 22 of the formed part 20 is sealed with the sealing layer 70.

For all embodiments, each channel 52 of the fluidic chip 10 is partially defined by a groove 50 formed in the material of the planar body 29. Each groove 52 is formed in the lower surface 22 of the planar body 29 such that the upper surface of the sealing layer 70 and a groove 52 together define a channel 52 when the formed part 20 is sealed with the sealing layer 70. The channels 52 provide fluid connection between various inlets 32 and fluid chambers 42 of the fluidic chip 10 as may be desired.

By configuring the formed part 20 to have various numbers and configurations of the fluid inlet 32, the inlet cap 39, the well 40 and the groove 50 as described above, when the lower surface 22 of the planar body 29 is sealed with the sealing layer 70, different configurations of the fluidic chip 10 having various numbers and configurations of the fluid inlet 32, the inlet cap 39, the fluid chamber 42 and the channel 52 may be obtained. In this way, in addition to providing a function of fluid storage, the fluidic chip 10 may be configured to allow specific reactions and tests to be performed using the fluidic chip 10 by configuring the formed part 20 and the sealing layer 70 of the fluidic chip 10 appropriately as desired, as will be described in greater detail below with.

FIG. 1A shows a first exemplary embodiment of a fluidic chip 10 with resealable fluid inlets 32. A bottom view of a formed part 20 of this fluidic chip 10 is shown in FIG. 1B. The formed part 20 comprises a well 40 connected between a first and a second through hole 30-1, 30-2 via a first and a second groove 50-1, 50-2 respectively formed into the lower surface 22 of the planar body 29. Each through hole 30-1, 30-2 is provided with its respective inlet cap 39-1, 39-2. The well 40 comprises a well bottom 44 encircled by well walls 46. When the lower surface 22 of the formed part 20 is sealed by the sealing layer (not visible in FIG. 1A) of the fluidic chip 10, the fluidic chip 10 will have a first fluid chamber 42 in fluid communication with first and second fluid inlets 32-1, 32-2 via a first channel 52-1 and a second channel 52-2 respectively.

FIG. 2A shows a second exemplary embodiment of the fluidic chip 10. A bottom view of a formed part 20 of this fluidic chip 10 is shown in FIG. 2B. The formed part 20 comprises two wells 40 connected between a first and a second through hole 30-1, 30-2 via a first and a second groove 50-1, 50-2 respectively, and interconnected by an intermediate groove 50-M. The grooves 50-1, 50-2, 50-3 are formed into the lower surface 22 of the planar body 29. When the lower surface 22 of the formed part 20 is sealed by the sealing layer (not visible in FIG. 2A) of the fluidic chip 10, the fluidic chip 10 will have a first fluid chamber in fluid communication with a first fluid inlet via a first channel and a second fluid chamber in fluid communication with a second fluid inlet via a second channel, the two fluid chambers being in fluid communication with each other via the third channel.

In the second exemplary embodiment, each through hole 30-1, 30-2 is surrounded by a shallow depression 33 formed into the upper surface 21 of the planar body 29 as shown in FIG. 2A. The shallow depression 33 is configured to accommodate a piece of sealing tape or its equivalent that may be used to close the fluid inlet 32-1 or 32-2 after a fluid has been introduced into the fluidic chip 10 via the fluid inlet 32-1 or 32-2. Providing the shallow depression 33 allows an upper surface of the sealing tape or its equivalent to be flush with the upper surface 21 of the planar body 29 so that the upper surface 21 remains level even after the fluid inlets 32-1, 32-2 have been closed with sealing tape or its equivalent.

A third exemplary embodiment of the fluidic chip 10 as shown in FIGS. 3A and 3B may be configured to allow PCR to be carried out in the first fluid chamber 42 by providing on the sealing layer 70 a dc heater 100 as described in PCT application number PCT/SG2015/052062 and as shown in FIG. 3B. A discrete heating area 120 of the dc heater 100 is provided on a lower surface 72 of the sealing layer 70 adjacent the first fluid chamber 42. A conductive trace 142 of the dc heater 100 is disposed on the lower surface 72 of the sealing layer 70 in an undulating configuration 160 at least partially around the discrete heating area 120. When supplied with a dc voltage (described in greater detail below), the conductive trace 142 heats the discrete heating area 120 to a uniform desired temperature (e.g. 100° C. or higher), thereby heating fluid contained in the first fluid chamber 142. By appropriately controlling the dc voltage supplied to the conductive trace 142, thermal cycling can be effected in the first fluid chamber 42 for PCR to take place in a reaction mixture contained in the first fluid chamber 42. As can be seen in FIG. 3A, the fluid chamber 42 of this embodiment comprises a well having a curved well bottom, unlike the flat well bottom 44 of the first embodiment as shown in FIG. 1A.

FIGS. 4A and 4C show a fourth exemplary embodiment of a fluidic chip 10 that allows PCR to take place in the first three fluid chambers 42-1, 42-2, 42-3 (configured in the same way as the third exemplary embodiment described above with reference to FIGS. 3A and 3B) as well as to allow further tests to be performed on the PCR products. A bottom view of a formed part 20 of this fluidic chip 10 is shown in FIG. 4B.

In the fourth exemplary embodiment, the formed part 20 as shown in FIG. 4B comprises first, second, third and fourth through holes 30-1, 30-2, 30-3, 30-4 and four final through holes 30-5 that respectively serve as first, second, third and fourth fluid inlets 32-1, 32-2, 32-3, 32-4 and four final inlets 32-5 of the fluidic chip 10 respectively. The formed part 20 also comprises five wells 40-1, 40-2, 40-3, 40-4, 40-5 that define five fluid chambers 42-1, 42-2, 42-3, 42-4, 42-5 respectively when the formed part 20 is sealed with the sealing layer 70. The formed part 20 further comprises six grooves 50-1, 50-2, 50-3, 50-4, 50-5, 50-6 that define six channels 52-1, 52-2, 52-3, 52-4, 52-5, 52-6, four final grooves 50-7 that define four final channels 52-7, and two intermediate grooves 50-M that define two intermediate channels 52-M respectively when the formed part 20 is sealed with the sealing layer 70.

The first fluid inlet 32-1 is in fluid communication with the first fluid chamber 42-1 via the first channel 52-1.

The first fluid chamber 42-1 is in fluid communication with the second fluid chamber 42-2 via one of the two intermediate channels 52-M.

The second fluid chamber 42-2 is in fluid communication with the third fluid chamber 42-3 via the second intermediate channel 52-M.

The third fluid chamber 42-3 is in fluid communication with the second fluid inlet 32-2 via the second fluid channel 52-2.

The second fluid inlet 32-2 is in fluid communication with the third fluid inlet 32-3 via the third channel 52-3.

The third fluid inlet 32-3 is also in fluid communication with the fourth fluid chamber 42-4 via the fourth channel 52-4.

The fourth fluid chamber 42-4, via the fifth channel 52-5, is in fluid communication with a sixth channel 52-6 that is formed as an undulating flow path to serve as a mixer 52-6 for facilitating mixing therein.

The fourth fluid inlet 32-4 is provided along the fifth channel 52-5.

The sixth channel or mixer 52-6 is in fluid communication with the fifth fluid chamber 42-5.

The fifth fluid chamber 42-5 is in fluid communication with the four final inlets 32-5 via the four final channels 52-7.

Each of the final inlets 32-5 may be configured to be in fluid communication with each of four sample pads 85 of four lateral flow tests 80 that may be provided beneath the sealing layer 70 of the fluidic chip 10, as shown in FIG. 4C. This may be achieved by providing an appropriate opening or openings in the sealing layer 70 beneath the four final inlets 32-5 to allow fluid in the fifth fluid chamber 42-5 to flow onto each of the four sample pads 85 via each of the four final channels 52-7 respectively. The four lateral test strips 80 may each be configured to detect and/or quantify a different target analyte in the fluid contained in the fifth fluid chamber 42-5. All the inlets 32-1 to 32-5 may be provided with respective inlet caps 39-1 to 39-5.

From the exemplary embodiments described above, it can be seen that the fluidic chip 10 comprising the formed part 20 and sealing layer 70 can be configured to perform different functions by appropriately configuring the formed part 20 and the sealing layer 70 as may be desired. Where the fluidic chip 10 is intended to serve purely as a fluidic chip, the sealing layer 70 may comprise a single pliable layer. Where the fluidic chip 10 is intended to function as an integrated fluidic chip to perform PCR therein, the sealing layer 70 may include a dc heater 100 formed thereon with the formed part 20 configured to be adjacent one or more wells 40 provided in the formed part 20. Additionally, the fluidic chip 10 may be configured to allow the reaction products from the PCR to be tested in the same fluidic chip 10 without having to transfer the reaction products to a different device, as described above with reference to FIGS. 4A to 4C. In this way, the fluidic chip 10 is advantageous over conventional PCR tubes and other fluid sample containers because the same fluidic chip 10 may be used for storing, transporting and in situ testing of the fluid contained therein, thereby avoiding any accidental spills, loss or contamination of the fluid.

Figure 6A:
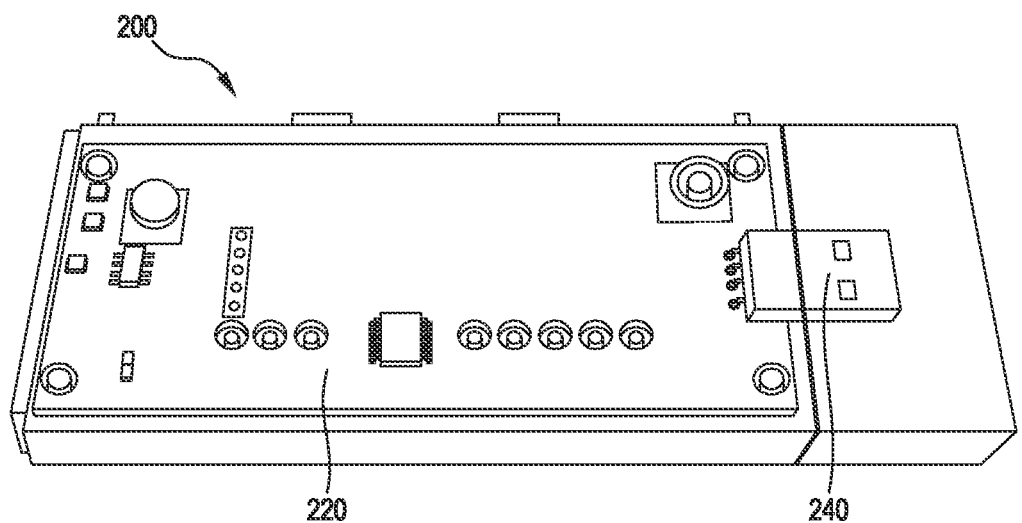
FIG. 6A is a photograph of a prototype of a controller cassette in a closed position for use with the fluidic chip to perform PCR in the fluidic chip.
Figure 6B:
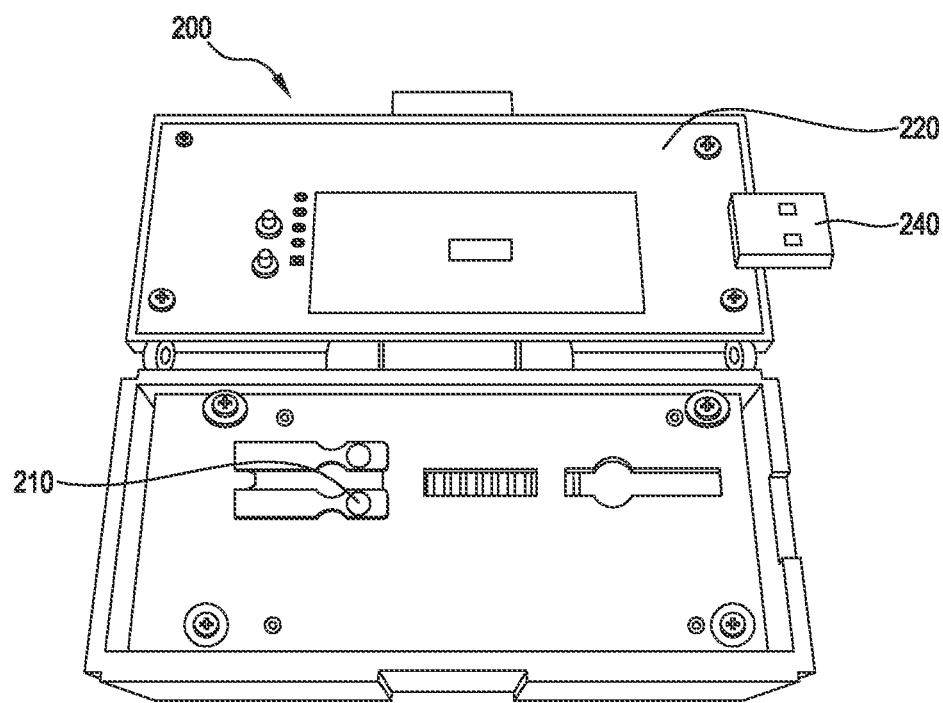
FIG. 6B is a photograph of the prototype of the controller cassette of FIG. 6A in an open position.
Figure 6C:
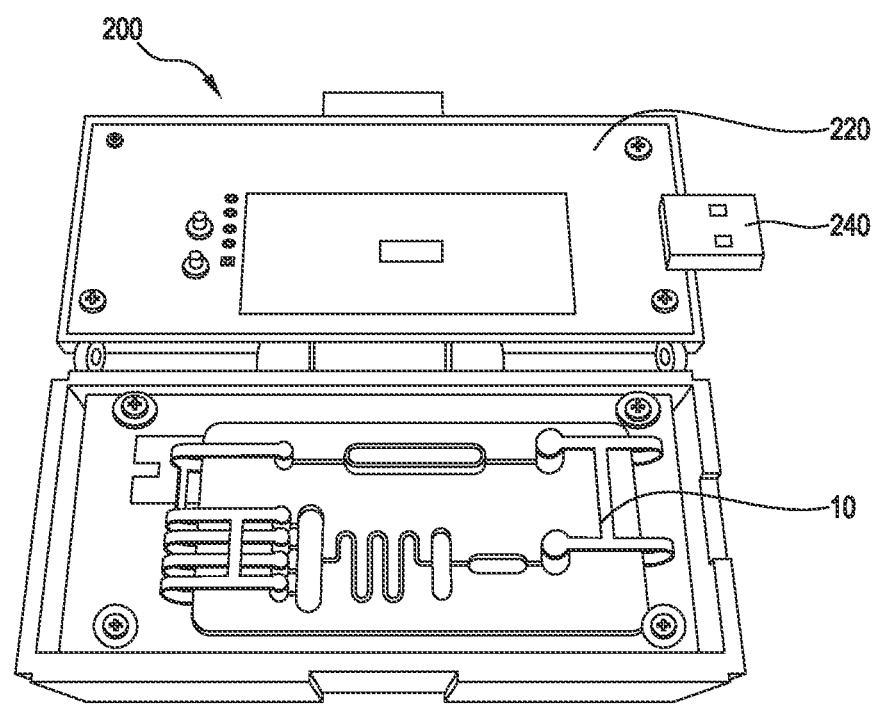
FIG. 6C is a photograph of the prototype of the controller cassette of FIG. 6A in an open position having the fluidic chip of FIGS. 4A and 4B placed thereon.

The first and third exemplary embodiments of the fluidic chip 10 may be about 2 cm wide by 5.5 cm long by 3 mm thick. The fourth exemplary embodiment of the fluidic chip 10 may be about 4 cm wide by 5 cm long by 3 mm thick. The second exemplary embodiment may be only 0.5 mm thick, having no well walls and no inlet walls. Appreciably, the fluidic chip 10 may be of any desired size other than the dimensions described above according to its desired application or applications. With its generally planar form, the fluidic chip 10 is thus readily portable and space-saving compared to currently available PCR tubes. Preferably, the fluidic chip 10 is configured for only one-time use, as a disposable consumable item.

Where the fluidic chip 10 is configured for PCR to be performed therein, the fluidic chip 10 is configured to be used with a controller cassette 200 configured to provide and control the dc voltage supplied to the dc heater 100 provided on the lower surface 72 of the sealing layer 70 of the fluidic chip 10, as shown in FIG. 5A. As shown in FIG. 6B, the controller cassette 200 has conductive contact points 210 configured to form an electrical contact with terminals of the conductive trace 142 of the dc heater 100. A voltage controlled by circuitry 220 and software of the controller cassette 200 is supplied via the contact points 210 to the dc heater 100 of the fluidic chip 10 that is placed on the controller cassette 200. The circuitry 200 and software are configured to apply the voltage in a manner suitable for effecting thermal cycling of the discrete heating area 120 of the dc heater 100 of the fluidic chip 100 so that PCR can take place in the fluid chamber 42 which is adjacent the discrete heating area 120.

The controller cassette 200 is configured to be battery powered or to be powered by a power bank or to draw power from a portable computing device such as a laptop, mobile phone, tablet and the like (not shown). To that end, the controller cassette 200 may be provided with a USB connection 240 for connecting with the electronic device. In this way, the controller cassette 200 is also readily portable. In an exemplary embodiment, the controller cassette 200 may be 5 cm wide by 10 cm long by 2 cm thick.

Connection with a computing device also allows the controller cassette 200 to be programmed to generate desired voltage cycles for the dc voltage in order to provide the desired thermal cycling configuration to the fluidic chip 10, since different PCR reactions (e.g. qPCR, dPCR, PCR) require different thermal cycling configurations. In an exemplary embodiment, the controller cassette 200 is provided with one or more preset thermal cycles that may be selected by a user depressing one or more buttons provided on the controller cassette 200 such that the controller cassette 200 may be operated without connection to any computing device. For example, a single button that is provided to turn the controller cassette 200 on or off may also be configured to be used to select preset cycles by the number of times in succession or a length of time that the single button is depressed. The controller cassette 200 is preferably also provided with a number of LED lights and wording or symbols adjacent thereto for indicating to the user which cycle or operating state the controller cassette 200 is currently in. In one embodiment, a display screen such as an LCD display may further be provided to display to the user information such as temperature, cycle, operating state and so on.

Whilst there has been described in the foregoing description exemplary embodiments of the present invention, it will be understood by those skilled in the technology concerned that many variations in details of design, construction and/or operation may be made without departing from the present invention. For example, the various features of the different embodiments of the fluidic chip may be combined differently to form a fluid chip having a different combination of features than each of the specific embodiments described above. Although in the described embodiments and figures the fluid chambers are configured to be in fluid connection with the various fluid inlets via channels provided in the fluidic chip, in other embodiments, a fluid chamber of the fluidic chip may be in immediate fluid communication with a fluid inlet without any channel therebetween. To that end, a well of the formed part may be provided with its own inlet. Thus, the number of fluid inlets and wells in the formed part may range from one to any desired quantity respectively, and the number of grooves in the formed part may range from zero to any desired quantity, so as to form at least one fluid inlet and at least one fluid chamber in the fluidic chip when the formed part is sealed with the sealing layer. Although polypropylene has been mentioned as being a possible material for the formed part, the formed part may be made of any other suitable material such as polyethylene or polycarbonate. While it has been described that the fluidic chip may provided with lateral test flow strips as shown in FIG. 4C, the fluidic chip may additionally or alternatively be provided with other fluid analysis components that are similarly configured to directly receive and test fluid within the fluidic chip. Examples of other fluid analysis components include chromatography paper, dipstick chemical pads, among others. While the planar body of the formed part has been depicted in the figures as having a generally rectangular shape with rounded corners, the planar body may be of any other shape as may be desired.

The invention claimed is:

1. A fluidic chip comprising:
   a sealing layer having an upper surface and a lower surface; and
   a formed part comprising a planar body having a lower surface sealed with the upper surface of the sealing layer, the planar body having a number of through holes and a number of wells in fluid communication with the number of through holes,
   wherein together with the upper surface of the sealing layer, the number of through holes and the number of wells respectively define a number of fluid inlets and a number of fluid chambers in fluid connection with each other in the fluidic chip;
   wherein each of the number of wells comprises a well bottom connected to and spaced apart from an upper surface of the planar body by a well wall encircling the well bottom so that the wells protrude from the planar body, each of the number of wells being integral with the planar body.

2. The fluidic chip of claim 1, wherein the lower surface of the sealing layer is electrically non-conductive and provided with a dc heater having a discrete heating area made of a heat conductive material disposed on the lower surface of the sealing layer and a conductive trace configured to be supplied with a dc voltage and to heat the discrete heating area to a uniform temperature when supplied with the dc voltage, the conductive trace disposed in an undulating configuration on the lower surface of the sealing layer at least partially around the discrete heating area, the discrete heating area configured to be adjacent at least one of the number of fluid chambers.

3. The fluidic chip of claim 2, wherein the at least one of the number of fluid chambers adjacent the discrete heating area is configured to allow PCR to be performed therein.

4. The fluidic chip of claim 1, further comprising at least one lateral test strip provided beneath the sealing layer, the at least one lateral test strip having a sample pad configured to receive fluid contained in the fluidic chip.

5. The fluidic chip of claim 1, wherein the sealing layer is pliable and fluid-proof.

6. The fluidic chip of claim 1, wherein the number of through holes are integral with the planar body.

7. The fluidic chip of claim 1, wherein the planar body further comprises a number of grooves formed on the lower surface of the planar body, wherein together with the upper surface of the sealing layer, the number of grooves define a number of channels in fluid connection with the number of fluid inlets and the number of fluid chambers in the fluidic chip.

8. A PCR kit comprising:
   the fluidic chip of claim 2; and
   a controller cassette configured to provide and control the dc voltage supplied to the dc heater, the controller cassette having conductive contact points configured to form an electrical contact with terminals of the conductive trace of the dc heater, the controller cassette configured to be powered by at least one of: a battery, a power bank and drawing power from a portable computing device.

9. The PCR kit of claim 8, wherein the controller cassette is configured to be connected to the portable computing device to allow the controller cassette to be programmed to generate desired voltage cycles of the dc voltage for providing desired thermal cycling configurations to the fluidic chip.

10. The PCR kit of claim 8, wherein the controller cassette is configured to receive the fluidic chip thereon for the conductive contact points to come into contact with the terminals of the conductive trace of the dc heater.

* * * * *